(12) United States Patent
Chignola et al.

(10) Patent No.: US 9,330,882 B2
(45) Date of Patent: May 3, 2016

(54) PARTICLE BEAM DETECTOR

(71) Applicant: Raytheon Company, Waltham, MA (US)

(72) Inventors: Bruce Chignola, Upton, MA (US); Timothy M. Norcott, Plaistow, NH (US); Brandon W. Blackburn, Idaho Falls, ID (US); Paul F. Martin, Sudbury, MA (US); Kenneth A. Levenson, Tewksbury, MA (US)

(73) Assignee: Raytheon Company, Waltham, MA (US)

( * ) Notice: Subject to any disclaimer, the term of this patent is extended or adjusted under 35 U.S.C. 154(b) by 120 days.

(21) Appl. No.: 14/451,289

(22) Filed: Aug. 4, 2014

(65) Prior Publication Data

US 2016/0035536 A1 Feb. 4, 2016

(51) Int. Cl.
*H01J 37/22* (2006.01)
*G01T 1/29* (2006.01)
*H01J 37/244* (2006.01)
*H01J 37/26* (2006.01)

(52) U.S. Cl.
CPC ............. *H01J 37/224* (2013.01); *H01J 37/244* (2013.01); *H01J 37/261* (2013.01); *H01J 2237/04* (2013.01); *H01J 2237/2446* (2013.01); *H01J 2237/24585* (2013.01)

(58) Field of Classification Search
CPC .................. H01J 37/224; H01J 37/244; G01T 1/29–1/2921
See application file for complete search history.

(56) References Cited

U.S. PATENT DOCUMENTS

| | | | | |
|---|---|---|---|---|
| 4,988,878 A | * | 1/1991 | VanZwienen | ......... H01J 37/244 250/397 |
| 7,279,882 B1 | * | 10/2007 | Degtiarenko | .......... G01N 23/06 250/397 |
| 2013/0105710 A1 | * | 5/2013 | Kirkpatrick | ....... H01L 21/26566 250/472.1 |

* cited by examiner

*Primary Examiner* — Robert Kim
*Assistant Examiner* — Eliza Osenbaugh-Stewar (57) ABSTRACT

A particle beam detector is disclosed. The particle beam detector can include a particle beam receiving portion configured to convert particle beam energy to heat, and a plurality of temperature measuring devices disposed about the particle beam receiving portion. A location of a particle beam on the particle beam receiving portion can be determined by a temperature difference between at least two of the plurality of temperature measuring devices.

19 Claims, 4 Drawing Sheets

PARTICLE BEAM DETECTOR

GOVERNMENT LICENSE RIGHTS

This invention was made with government support under contract HDTRA1-10-C-0002 awarded by the Defense Threat Reduction Agency. The government has certain rights in the invention.

BACKGROUND

Optical transmission radiation (OTR) screens are typically used to visualize the location, shape, energy spread, and/or size of a particle or electron beam generated by a linear accelerator. The result of a particle or electron beam passing through the OTR screen is visible light, which can be captured using a camera, such as a triggered digital camera, located out of the path of the beam.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Although optical transmission radiation (OTR) screens have proven effective at visualizing the location, shape, energy spread, and/or size of a particle or electron beam, the proximity of the cameras used to view the OTR to high radiation sources typically results in damage to the cameras over time, which often ends in complete failure of the cameras. When a camera fails there is usually no other way to determine the location, shape, energy spread, and/or size of a particle or electron beam. Thus, needs exist for a particle beam detector that remains functional when subjected to high radiation over time.

Accordingly, a particle beam detector is disclosed that is less sensitive to high radiation. In one aspect, the particle beam detector can provide redundancy for determining the location, shape, energy spread, and/or size of a particle or electron beam when visualizing an OTR screen with a camera. The particle beam detector can include a particle beam receiving portion configured to convert particle beam energy to heat and a plurality of temperature measuring devices disposed about the particle beam receiving portion. A location of a particle beam on the particle beam receiving portion can be determined by a temperature difference between at least two of the plurality of temperature measuring devices.

A particle beam detector system is also disclosed. The particle beam detector system can comprise a particle beam source configured to generate a particle beam and a particle beam detector. The particle beam detector can include a particle beam receiving portion configured to convert particle beam energy to heat, and a plurality of temperature measuring devices disposed about the particle beam receiving portion. A location of the particle beam on the particle beam receiving portion can be determined by a temperature difference between at least two of the plurality of temperature measuring devices.

In addition, an inspection system is disclosed. The inspection system can comprise a particle beam source operable to generate a particle beam and having a beam steering device to bend the particle beam about at least one steering axis. The inspection system can also comprise a particle beam converter to convert the particle beam to a gamma emission. The inspection system can further comprise a collimator to collimate the gamma emission into a gamma beam to be directed at an object. The inspection system can still further comprise two particle beam detectors spaced apart from one another and positioned to receive the particle beam prior to the particle beam converter. In addition, the inspection system can comprise a support structure in support of the two particle beam detectors, the particle beam converter, and the collimator. The two particle beam detectors can be operable to determine an orientation of the particle beam. The support structure can be movable in at least one rotational degree of freedom relative to the particle beam source to facilitate alignment of the particle beam converter and the collimator with the particle beam when the particle beam bends about the at least one steering axis.

Figure 1:
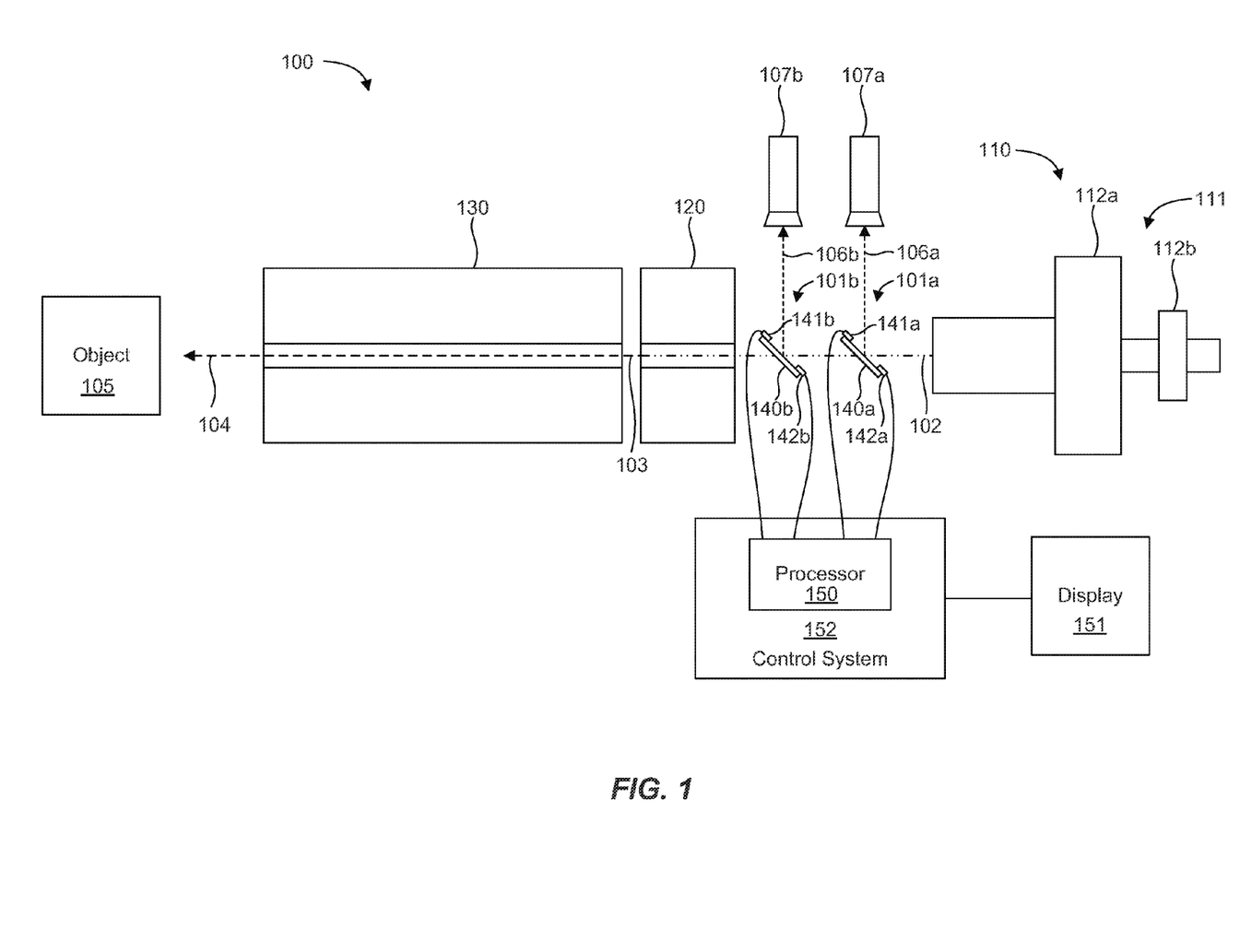
FIG. 1 is an illustration of a particle beam detector system in accordance with an example of the present disclosure.

One embodiment of a particle beam detector system 100 is illustrated schematically in FIG. 1. The particle beam detector system 100 can comprise a particle beam source 110, such as a particle accelerator, configured to generate a particle or electron beam 102. The particle beam source 110 can include a beam steering device 111 to bend or steer the particle beam 102 about one or more steering axes. For example, the beam steering device 111 can include magnets 112a, 112b to steer the beam 102 in two directions, such as by bending the beam around two orthogonal axes.

The system 100 can also include a particle beam converter 120 to convert the particle beam 102 to a gamma emission 103, and a collimator 130, which can have an adjustable shape and/or diameter (i.e., an adjustable lead leaf collimator), to collimate the gamma emission 103 into a gamma beam 104. The gamma beam 104 can be directed at an object 105 to determine whether the object 105 has fissile material, for example.

In addition, the system 100 can include two particle beam detectors 101a, 101b spaced apart from one another and positioned to receive the particle beam 102 prior to the particle beam converter 120. The two particle beam detectors 101a, 101b can be used to align the particle beam converter 120 and/or the collimator 130 with the particle or electron beam 102. For example, the particle beam detectors 101a, 101b can provide two points of reference to determine the path or orientation of the particle beam 102 upon exiting the particle beam source 110. The particle beam detectors 101a, 101b can therefore be spaced apart from one another by any suitable distance, although, in general, a greater distance will provide improved accuracy. In one aspect, the two particle beam detectors 101a, 101b, the particle beam converter 120, and the collimator 130 can be aligned with one another such that the center of the collimator 130 aligns with a known location on the particle beam detectors 101a, 101b, such as a center point or region of the particle beam detectors 101a, 101b. The particle beam detectors 101a, 101b, the particle beam converter 120, and the collimator 130 can be aligned with one another by any suitable manner, such as by using a laser. Thus, the two particle beam detectors 101a, 101b can be operable to determine an orientation of the particle beam 102 to facilitate alignment of the particle beam converter 120 and the collimator 130 with the particle beam 102 when the particle beam 102 is steered or bends about the one or more steering axes to interrogate the object 105 with the gamma beam 104. For example, the position of the particle beam 102 relative to the location of the collimator center on the particle beam detectors 101a, 101b can be used to position and/or orient the collimator 130 (and the converter 120) so that the collimator 130 aligns with the particle beam 102, which exits the particle beam converter 120 as the gamma emission 103.

As illustrated, each particle beam detector 101a, 101b can have a particle beam receiving portion 140a, 140b configured to convert particle beam energy to heat. The particle beam receiving portion can also be configured to allow at least a portion of the particle beam 102 to pass through to the particle beam converter 120. For example, the particle beam receiving portion 140a, 140b can comprise a metallic foil, such as an aluminum foil or a gold foil. In one aspect, the particle beam receiving portion 140a, 140b can comprise aluminum and/or gold coated on polyethylene terephthalate, such as MYLAR®, silver or silicon. In one aspect, the particle beam receiving portion 140a, 140b can have a thickness of about 1 μm or less. In one example, the particle beam receiving portions 140a, 140b comprise OTR screens, which can be used to visualize the location, shape, energy spread, and size of the particle beam 102. A result of the particle beam 102 passing through the OTRs is visible light 106a, 106b, which can be captured or viewed using optical sensors 107a, 107b, such as cameras, located out of the path of the particle beam 102. An OTR can therefore provide a visual means by which to monitor location, shape, size, and energy spread of the particle beam 102 from a remote location.

In one aspect, each particle beam detector 101a, 101b can have a plurality of temperature measuring devices 141a, 142a and 141b, 142b, such as thermocouples, disposed about the particle beam receiving portions 140a, 140b, respectively, to sense heat from the particle beam 102 as it passes through the particle beam receiving portions 140a, 140b. In one aspect, the particle beam 102 can locally heat the particle beam receiving portions 140a, 140b as the beam 102 passes through the particle beam receiving portions 140a, 140b. Locations of the particle beam 102 on the respective particle beam receiving portions 140a, 140b can therefore be determined by temperature differences between two of the plurality of temperature measuring devices 141a, 142a and 141b, 142b. Any type of thermocouple may be used that is suitable for a given temperature range.

In one aspect, data from the temperature measuring devices 141a, 142a and 141b, 142b can be sent to a processor 150 to identify the location of the particle beam 102 relative to the center of the collimator 130, such as by comparing the location of the particle beam 102 on the particle beam receiving portions 140a, 140b to the center of the collimator 130 projected onto the particle beam receiving portions 140a, 140b. In another aspect, the processor 150 can convert the temperature data into an image to visually illustrate the location of the beam relative to the OTR (or center of the collimator on the OTR) on a display 151. Thus, a graphical representation of the beam intensity can be provided based on the temperature readings. Temperature data can also be used by a control system 152 to position and/or orient the collimator 130 to align the collimator 130 with the particle beam 102. It should be recognized that temperature data can be presented in numerical or graphical form to enable an operator to control the position and/or orientation the collimator 130 to align the collimator 130 with the particle beam 102. The supporting electronics used for temperature readings, such as the processor 150, as well as any other aspect of the control system 152, can be remotely located to protect the electronics from exposure to radiation.

In one aspect, the temperature measuring devices 141a, 142a can be insensitive to high radiation fields. Thus, the temperature measuring devices 141a, 142a and 141b, 142b of the particle beam detectors 101a, 101b, respectively, can be used as a backup in case the optical sensors 107a, 107b fail, which can be a common occurrence in a high radiation environment. In another aspect, the temperature measuring devices 141a, 142a and 141b, 142b can be eliminate the need for optical sensors in the system 100, thus serving as an alternative to optical sensors in a high radiation environment.

Figure 2:
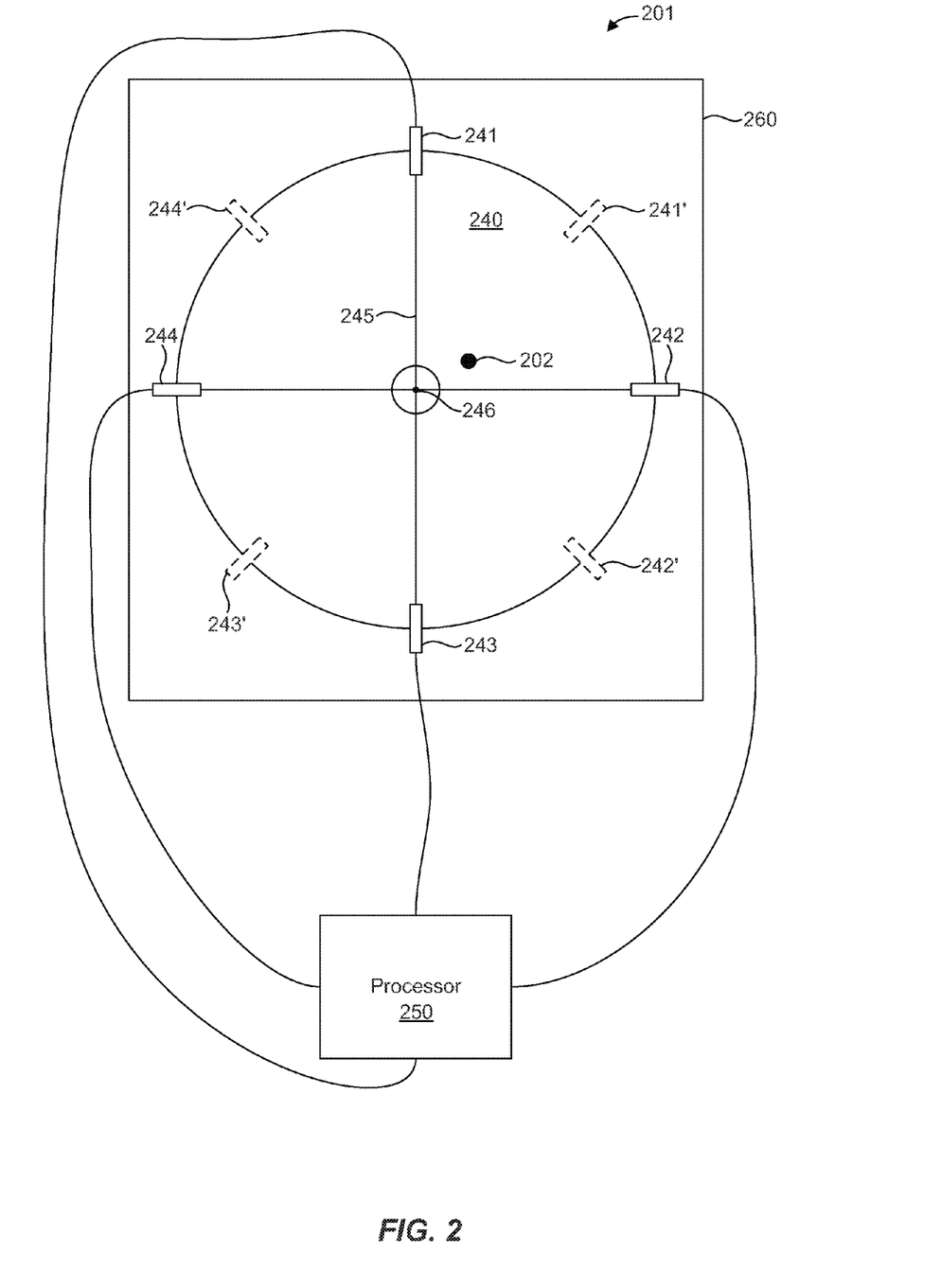
FIG. 2 is an illustration of a particle beam detector in accordance with an example of the present disclosure.

FIG. 2 illustrates a particle beam detector 201, in accordance with an example of the present disclosure. The particle beam detector 201 is similar in many respects to the particle beam detectors 101a, 101b discussed above with respect to FIG. 1. For example, the particle beam detector 201 can include a particle beam receiving portion 240 and a plurality of temperature measuring devices 241-244, which can be coupled to a processor 250. In addition, the particle beam detector 201 can include a mounting fixture 260 to support the plurality of temperature measuring devices 241-244 about the particle beam receiving portion 240.

In one aspect, the temperature measuring devices 241-244 can be positioned about the particle beam receiving portion 240 in a configuration that facilitates the measurement of the differential temperatures by two or more of the temperature measuring devices 241-244. For example, temperature measuring devices 241, 242 and/or 243, 244 can be diametrically opposite one another about the particle beam receiving portion 240 to facilitate identifying the location of a particle beam 202 relative to the particle beam receiving portion 240. The diametrically opposite pairs of temperature measuring devices 241, 242 and/or 243, 244 can be arranged perpendicular to one another to determine the vertical location and/or the horizontal location of the particle beam 202 on the particle beam receiving portion 240. In one aspect, a reticle 245 having a center 246 can be used as a reference for the location of the particle beam 202 relative to the particle beam receiving portion 240.

In operation, as the particle beam 202 is steered vertically and/or horizontally across the particle beam receiving portion 240, the beam's proximity to one or more of the temperature measuring devices 241-244 will cause a change in temperature. By measuring and monitoring temperature differentials between sets of temperature measuring devices (i.e., temperature measuring devices 241, 242 for vertical location and temperature measuring devices 243, 244 for horizontal location) and while simultaneously steering the particle beam 202 and/or moving the particle beam detector 201, the particle beam 202 can be positioned at any desired location relative to the particle beam detector 201. In general, the center 246 of the reticle 245 will correspond to a center of a collimator and/or a particle beam converter. Thus, to ensure alignment of the beam 202 with the collimator and/or the particle beam converter, centers of the collimator and/or the particle beam converter can be aligned with centers 246 of two or more particle beam detectors 201. Thus configured, the beam 202 can be steered and/or the collimator/particle beam converter can be positioned and/or oriented such that the beam 202 passes through the centers 246 of the particle beam detectors 201.

It should be recognized that any suitable number of temperature measuring devices can be used. In addition, the temperature measuring devices can be positioned relative to one another in arrangements other than opposing one another. Still further, any pair of temperature measuring devices can be utilized to provide the functions as described herein, regardless of whether the pair of temperature measuring devices are in an opposing arrangement.

For example, temperature measuring devices 241-244 and 241'-244' can be used to increase the accuracy or resolution of the beam location determination relative to the particle beam receiving portion 240. In addition, the temperature measuring devices can be disposed in any suitable location about the particle beam receiving portion 240, depending on the size and/or shape of the beam 202. For example, the shape of the beam 202 may not be circular, such as when bending or steering the beam 202 reveals an energy spread. In this case, the position of the temperature measuring devices 241-244 and 241'-244' relative to the beam true center can be adjustable to improve accuracy. In one aspect, the position of the temperature measuring devices 241-244 and 241'-244' can be adjusted inwards toward the center 246 to improve position accuracy of the beam 202. Such adjustments can be performed manually or under automated control via a motor coupled to the mounting fixture 260.

Figure 3A:
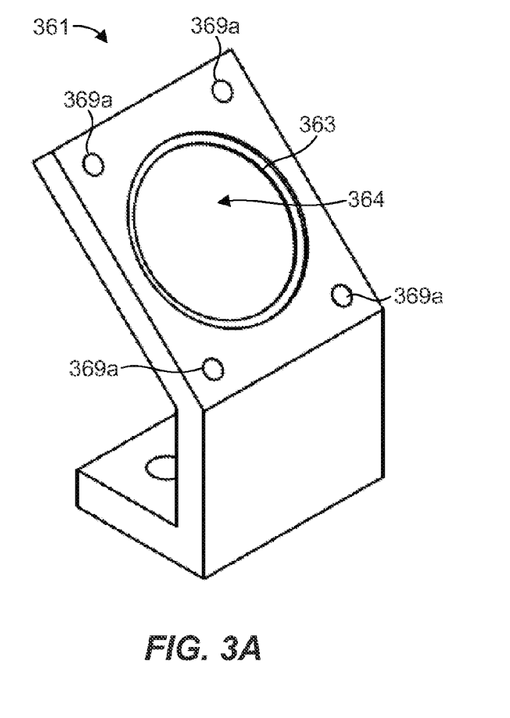
FIG. 3A is a perspective view of a base of a particle beam detector mounting fixture in accordance with an example of the present disclosure.
Figure 3B:
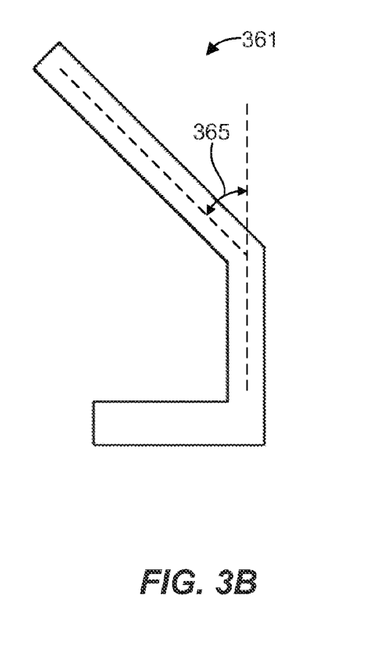
FIG. 3B is a side view of the base of a particle beam detector mounting fixture of FIG. 3A.
Figure 4:
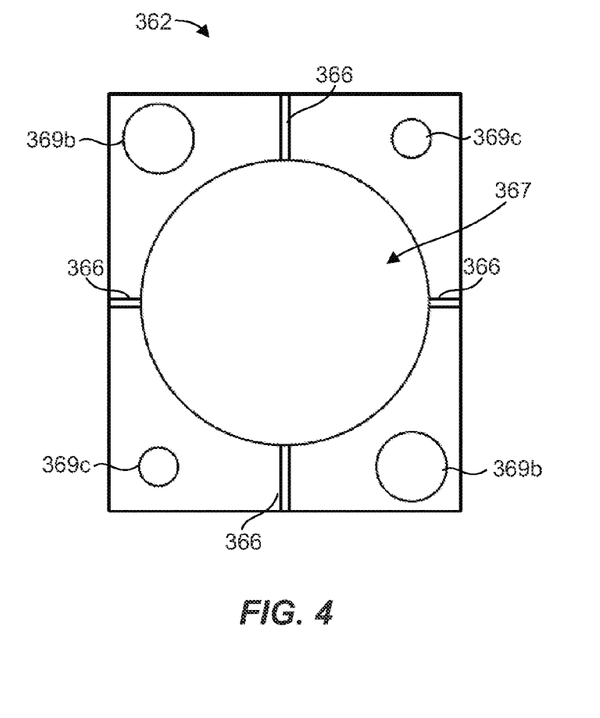
FIG. 4 is an illustration of a clamp of a particle beam detector mounting fixture in accordance with an example of the present disclosure.

FIGS. 3A and 3B illustrate a base 361 and FIG. 4 illustrates a clamp 362 of a mounting fixture of a particle beam detector, in accordance with an example of the present disclosure. The base 361 can include an inner flange 363 configured to support a particle beam receiving portion and define an opening 364 through which a particle beam can pass. In one aspect, the base 361 can be configured to orient the particle beam receiving portion at an angle 365 to facilitate directing visible light from the particle beam receiving portion to an optional optical sensor. The base 361 can also be configured to mount to a supporting surface or structure.

The damp 362 can be configured to support a plurality of temperature measuring devices about the particle beam receiving portion supported by the flange 363 of the base 361. For example, the clamp 362 can include channels or recesses 366 to secure temperature measuring devices about the particle beam receiving portion. The damp 362 can also include an opening 367 through which the particle beam can pass to the particle beam receiving portion.

Figure 5:
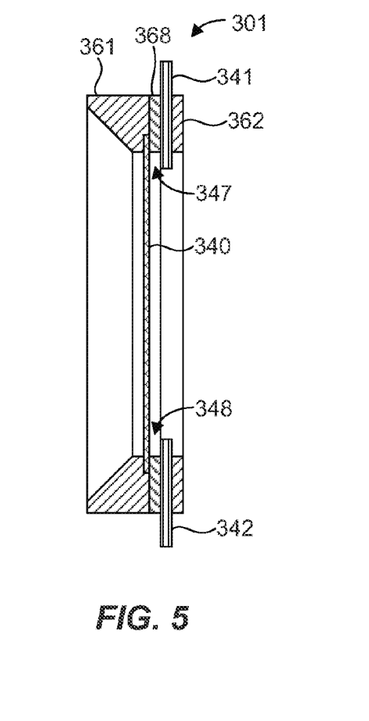
FIG. 5 is a detailed cross-sectional view of a particle beam detector in accordance with another example of the present disclosure.

With continued reference to FIGS. 3A-4, FIG. 5 illustrates a detailed cross-sectional view of a particle beam detector 301 in accordance with another example of the present disclosure. In particular, FIG. 5 shows a particle beam receiving portion holder 368 securing a particle beam receiving portion 340 to the base 361, and the damp 362 securing temperature measuring devices 341, 342 about the particle beam receiving portion 340. The base 361 can include one or more holes 369a configured to receive one or more fasteners (not shown) to couple the particle beam receiving portion holder 368 and the clamp 362 to the base 361. Holes 368b in the clamp 362 can provide access and clearance for fastener heads that secure the particle beam receiving portion holder 368 to the base 361. Holes 368c in the clamp 362 can provide clearance for fasteners that secure the clamp 362 to the base 361.

In one aspect, the particle beam detector mounting fixture can be configured to facilitate position adjustments of the temperature measuring devices 341, 342. For example, fasteners securing the clamp 362 to the base 361 can be loosened sufficient to allow repositioning of the temperature measuring devices 341, 342, after which the fasteners can be tightened to secure the temperature measuring devices 341, 342 in the new positions. The position of the temperature measuring devices 341, 342 relative to a given location of the particle beam receiving portion 340 can therefore be adjusted as desired depending on the need for accuracy and/or to accommodate beam size/shape.

In another aspect, the temperature measuring devices 341, 342 can be separated from the particle beam receiving portion 340 by a gap 347, 348, respectively. Thus, when the particle beam detector 301 is located outside of a vacuum, such as in an ambient atmospheric setting, the temperature measuring devices 341, 342 can be separated from the particle beam receiving portion 340 by a gas, such as air. The temperature measuring devices 341, 342 can therefore be located and configured to measure temperature (e.g., air temperature) about the particle beam receiving portion 340.

Figure 6:
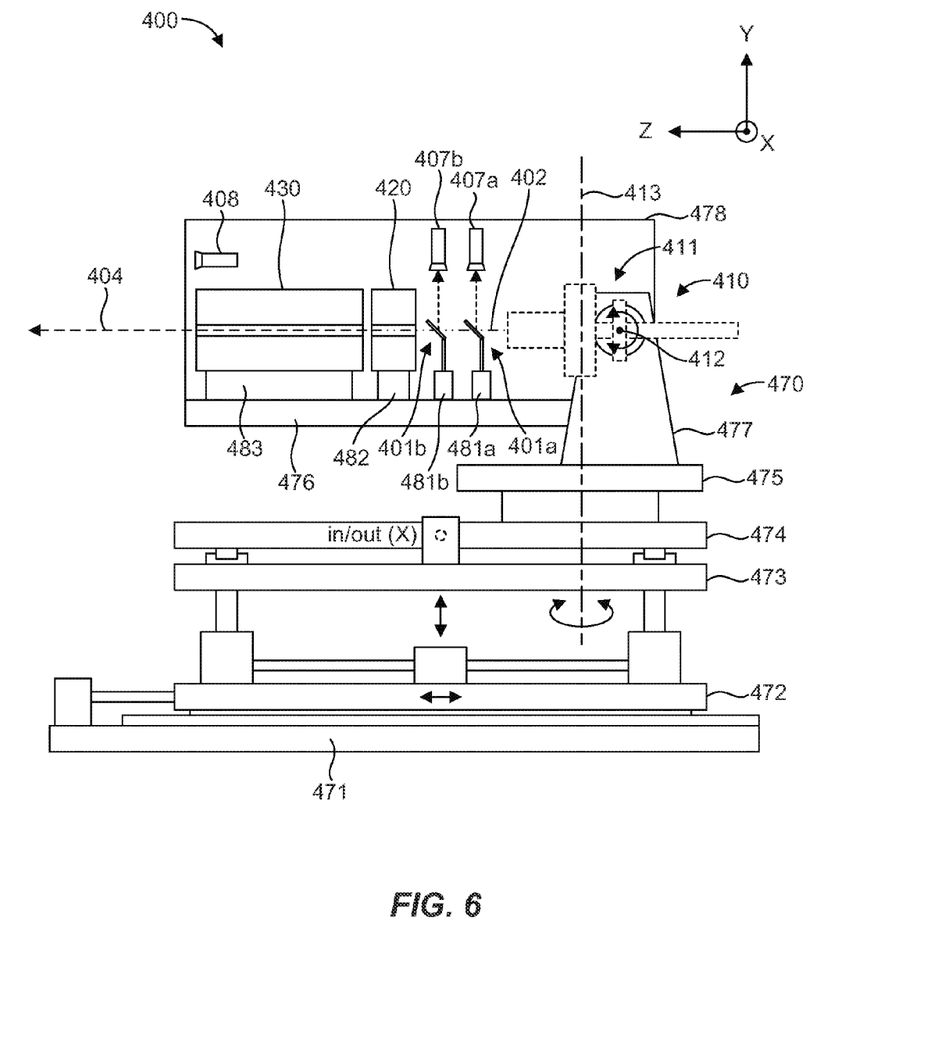
FIG. 6 is an illustration of a particle beam detector system in accordance with another example of the present disclosure.

FIG. 6 illustrates a particle beam detector system 400, in accordance with an example of the present disclosure. The particle beam detector system 400 may serve as an inspection system, for example, to detect nuclear material at standoff distances from a target or object. Similar to the system 100 of FIG. 1, the system 400 can include a particle beam source 410, particle beam detectors 401a, 401b, a particle beam converter 420, and a collimator 430, which can direct a gamma beam 404 at an object down-range (i.e., about 100 m to about 500 m) to determine whether the object has fissile material, for example. The particle beam source 410 can be operable to generate a particle beam 402 and can have a beam steering device 411 to bend the particle beam 402 about one or more steering axes 412, 413 or centers of rotation. The particle beam detectors 401a, 401b can be operable to determine a location and/or orientation of the particle beam 402, as described herein. In one aspect, the particle beam detectors 401a, 401b, the particle beam converter 420, and the collimator 430 can be alignable with one another, such as by being mounted on movable structures 481a, 481b, 482, 483, respectively.

In one aspect, the particle beam detectors 401a, 401b can include an OTR screen. Therefore, in a particular aspect, the system 100 can include an optical sensor 407a, 407b, such as a camera, to view the OTR screen to determine a location of the particle beam on the OTR screen. In addition, the system 100 can include a camera 408 or radiation sensor to view a target or object being scanned or inspected downrange. In another aspect, one or both of the particle beam detectors 401a, 401b can include a temperature measuring device, as described hereinabove, to identify the location of the particle beam 402 relative to a particle beam receiving portion of the particle beam detector 401a and/or 401b.

In addition, the system 400 can include a support structure 470 in support of the particle beam detectors 401a, 401b, the particle beam converter 420, and the collimator 430. The support structure 470 can be movable in one or more degrees of freedom relative to the particle beam source 410, which is supported independent of the support structure 470, to facilitate alignment of the particle beam converter 420 and/or the collimator 430 with the particle beam 402 when the particle beam bends about one or more of the steering axes 412, 413.

For example, the support structure 470 can be configured to provide movement in rotational and/or translational degrees of freedom to facilitate alignment of the particle beam converter 420 and/or the collimator 430 with the particle beam 402. As shown in the figure, the support structure 470 can have a base 471 to be disposed on a support surface or structure. A first support member 472 can be movable in a translational degree of freedom (i.e., the Z direction) relative to the base 471. The first support member 472 can support a second support member 473, which can be movable in a translational degree of freedom (i.e., the Y direction) relative to the first support member 472. The second support member 473 can support a third support member 474, which can be movable in a translational degree of freedom (i.e., the X direction) relative to the second support member 473. The third support member 474 can support a fourth support member 475, which can be movable in a rotational degree of freedom (i.e., about the Y axis) relative to the third support member 474. The fourth support member 475 can support a fifth support member 476, which can be movable in a rotational degree of freedom (i.e., about the X axis) relative to the fourth support member 475. The fifth support member 476 can provide a base or support for the particle beam detectors 401a, 401b, the particle beam converter 420, and the collimator 430. Thus, the support structure 470 can be movable in five degrees of freedom relative to the particle beam source 410, A riser 477 can elevate from the fourth support member 475 and can be rotatably coupled to a vertical support member 478, which can be fixed to the fifth support member 476. The riser 477 and the vertical support member 478 can be configured to provide an opening or space to accommodate the particle beam source 410. In one aspect, the riser 477 and/or the vertical support 478 can vertically position the fifth support member 476 to accommodate the particle beam source 410 such that the particle beam 402 can pass through the particle beam detectors 401a, 401b, the particle beam converter 420, and the collimator 430.

In one aspect, the rotational degree of freedom of the support structure 470 about the X axis can be aligned with the steering axis 412 of the particle beam source 410, and/or the rotational degree of freedom of the support structure 470 about the Y axis can be aligned with the steering axis 413 of the particle beam source 410. In this way, the respective steering axes 412, 413 or centers of rotation of the particle beam 402 can coincide with the rotational axes of the support structure 470, thus simplifying the movement of the support structure 470 needed to align the particle beam converter 420 and/or the collimator 430 with the particle beam 402 when the particle beam bends about one or both of the steering axes 412, 413. For example, the support structure 470 may only need to rotate as the particle beam 402 bends about axis 412 and/or 413 without translational movement.

Any suitable device or mechanism can be used to enable or facilitate translational and/or rotational movement between coupled support members of the support structure 470. For example, couplings between support members to facilitate translational and/or rotational movement can include a rail, track, bearing, bushing, wheel, roller, channel, groove, pivot, trunnion, hinge, or any other suitable translational and/or rotational coupling. In addition, any suitable device or mechanism can be used to cause relative translational and/or rotational movement between coupled support members of the support structure 470, such as a motor, a pump, a hydraulic or pneumatic ram, etc. In one example, a stepper or servo motor can be used, which can be coupled to a drive train, such as one or more gears or a linkage mechanism.

Control of the support structure 470 movement in one or more degrees of freedom can be local and/or remote relative to the support structure 470. For example, a control panel providing control of the support structure 470 can be proximate the support structure 470 and/or remotely located to facilitate operation of the support structure 470 by a user. In one aspect, the particle beam detectors 401a, 401b, the optical sensors 407a, 407b, and/or the camera 408 can provide information and/or data that can be used to control the support structure 470. For example, images can be provided to an operator to enable the operator to move the support structure 470 to align the collimator 430 with the particle beam 402 and/or to direct the gamma beam 404 down-range to scan or interrogate a target. In one aspect, control of the support structure 470 can be automated and/or computer controlled using a control algorithm. Thus, during operation and scanning of a down-range target, the particle beam detectors 401a, 401b, the optical sensors 407a, 407b, and/or the camera 408 can be used to control the movable support structure 470 to actively maintain alignment of the particle beam converter 420 and the collimator 430 with the particle beam 402 as the particle beam 402 is steered to scan the standoff target down-range with the gamma beam 404.

In one aspect, the system 100 can include radiation shielding, such as borated or virgin polyethylene shielding, as desired. For example, the vertical support 478 and/or the fifth support member 476 of the support structure 470 can include radiation shielding.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A particle beam detector, comprising:
    a particle beam receiving portion configured to convert particle beam energy to heat; and
    a plurality of temperature measuring devices disposed about the particle beam receiving portion,
    wherein a location of a particle beam on the particle beam receiving portion is determined by a temperature difference between at least two of the plurality of temperature measuring devices.

2. The particle beam detector of claim 1, wherein the plurality of temperature measuring devices are separated from the particle beam receiving portion by a gas.

3. The particle beam detector of claim 1, wherein the plurality of temperature measuring devices comprises at least one thermocouple.

4. The particle beam detector of claim 1, wherein the particle beam receiving portion comprises an optical transition radiation (OTR) screen.

5. The particle beam detector of claim 1, wherein the particle beam receiving portion comprises a metallic foil.

6. The particle beam detector of claim 1, wherein the particle beam receiving portion comprises aluminum, gold, polyethylene terephthalate, silver, silicon, or combinations thereof.

7. The particle beam detector of claim 1, wherein the particle beam receiving portion is configured to allow a portion of the particle beam to pass therethrough.

8. The particle beam detector of claim 1, further comprising a mounting fixture to support the plurality of temperature measuring devices about the particle beam receiving portion.

9. The particle beam detector of claim 8, wherein the mounting fixture is configured to facilitate position adjustments of the plurality of temperature measuring devices.

10. The particle beam detector of claim 1, wherein the at least two of the plurality of temperature measuring devices are diametrically opposite one another about the particle beam receiving portion.

11. A particle beam detector system, comprising:
    a particle beam source configured to generate a particle beam; and
    a particle beam detector, having
        a particle beam receiving portion configured to convert particle beam energy to heat, and
        a plurality of temperature measuring devices disposed about the particle beam receiving portion,
    wherein a location of the particle beam on the particle beam receiving portion is determined by a temperature difference between at least two of the plurality of temperature measuring devices.

12. The system of claim 11, wherein the particle beam source comprises a particle accelerator.

13. The system of claim 11, wherein the particle beam receiving portion comprises an optical transition radiation (OTR) screen.

14. The system of claim 13, further comprising an optical sensor configured to view the OTR screen to determine a location of the particle beam on the particle beam receiving portion.

15. An inspection system, comprising:
    a particle beam source operable to generate a particle beam and having a beam steering device to bend the particle beam about at least one steering axis;
    a particle beam converter to convert the particle beam to a gamma emission;
    a collimator to collimate the gamma emission into a gamma beam to be directed at an object;
    two particle beam detectors spaced apart from one another and positioned to receive the particle beam prior to the particle beam converter, wherein each particle beam detector comprises:
        a particle beam receiving portion configured to convert particle beam energy to heat; and
        a plurality of temperature measuring devices disposed about the particle beam receiving portion, wherein a location of the particle beam on the particle beam receiving portion is determined by a temperature difference between at least two of the plurality of temperature measuring devices; and
    a support structure in support of the two particle beam detectors, the particle beam converter, and the collimator,
    wherein the two particle beam detectors are operable to determine an orientation of the particle beam, and
    wherein the support structure is movable in at least one rotational degree of freedom relative to the particle beam source to facilitate alignment of the particle beam converter and the collimator with the particle beam when the particle beam bends about the at least one steering axis.

16. The system of claim 15, wherein an axis of the at least one rotational degree of freedom of the support structure is aligned with the at least one steering axis of the particle beam source.

17. The system of claim 15, wherein the support structure is movable in five degrees of freedom relative to the particle beam source.

18. The system of claim 15, wherein the two particle beam detectors, the particle beam converter, and the collimator are alignable with one another.

19. The system of claim 15, wherein the particle beam receiving portion comprises an optical transition radiation screen (OTR), and further comprising an optical sensor configured to view the OTR screen to determine a location of the particle beam on the particle beam receiving portion.

* * * * *